United States Patent
Lee

(10) Patent No.: US 9,634,102 B2
(45) Date of Patent: Apr. 25, 2017

(54) NONVOLATILE MEMORY DEVICES HAVING SINGLE-LAYERED FLOATING GATES

(71) Applicant: SK hynix Inc., Gyeonggi-do (KR)

(72) Inventor: Tae Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/069,282

(22) Filed: Mar. 14, 2016

(65) Prior Publication Data

US 2016/0197153 A1 Jul. 7, 2016

Related U.S. Application Data

(63) Continuation of application No. 14/470,652, filed on Aug. 27, 2014, now Pat. No. 9,318,497.

(30) Foreign Application Priority Data

Mar. 21, 2014 (KR) .................. 10-2014-0033655

(51) Int. Cl.
| | |
|---|---|
| H01L 29/788 | (2006.01) |
| H01L 29/417 | (2006.01) |
| H01L 27/11519 | (2017.01) |
| H01L 27/11521 | (2017.01) |
| H01L 21/28 | (2006.01) |
| H01L 29/423 | (2006.01) |

(52) U.S. Cl.
CPC .. *H01L 29/41758* (2013.01); *H01L 21/28273* (2013.01); *H01L 27/11519* (2013.01); *H01L 27/11521* (2013.01); *H01L 29/42328* (2013.01); *H01L 29/42332* (2013.01); *H01L 29/788* (2013.01); *H01L 29/7887* (2013.01)

(58) Field of Classification Search
CPC ......... H01L 29/41758; H01L 27/11519; H01L 27/11521; H01L 29/788
See application file for complete search history.

(56) References Cited

U.S. PATENT DOCUMENTS 5,338,953 A * 8/1994 Wake ............... H01L 27/11517
257/316

* cited by examiner

*Primary Examiner* — David Vu
(74) *Attorney, Agent, or Firm* — IP & T Group LLP

(57) ABSTRACT

A nonvolatile memory device includes a plurality of twin cells arrayed on a substrate. Each of the plurality of twin cells includes a drain mesa protruding from a surface of a substrate. A first source and a second source are disposed in the substrate and spaced apart from the drain mesa. A first floating gate overlaps with a first sidewall surface of the drain mesa and extends onto the first source, and a second floating gate overlaps with a second sidewall surface of the drain mesa and extends onto the second source. Related methods are also provided.

12 Claims, 25 Drawing Sheets

FIG. 8

|  | VOLTAGE CONDITION | | | |
|---|---|---|---|---|
|  | VBL | VSL0 | VSL1 | Vwell |
| PGM1 | Vpp | 0 | F | 0 |
| PGM2 | Vpp | F | 0 | 0 |
| ERS1 | 0 | Vpp | F | 0 |
| ERS2 | 0 | F | Vpp | 0 |
| READ1 | Vread | Vss | F | 0 |
| READ2 | Vread | F | Vss | 0 | ated.

NONVOLATILE MEMORY DEVICES HAVING SINGLE-LAYERED FLOATING GATES

CROSS-REFERENCES TO RELATED APPLICATIONS

This application is a continuation of U.S. patent application Ser. No. 14/470,652 filed on Aug. 27, 2014, which claims priority under 35 U.S.C 119(a) to Korean Application No. 10-2014-0033655, filed on Mar. 21, 2014, with the Korean intellectual property Office. The disclosure of each of the foregoing applications is incorporated herein by reference in its entirety.

BACKGROUND

1. Technical Field

Various embodiments relate to nonvolatile memory devices having single-layered floating gates.

2. Related Art

Electrically erasable programmable read only memory (EEPROM) devices are one of nonvolatile memory devices that retain their stored data even when their power supplies are interrupted, and various memory cell structures of the EEPROM devices have been proposed to improve performance. A general unit memory cell of the EEPROM devices employs a stacked gate structure including a floating gate, a control gate electrode, and an inter-gate dielectric layer between the floating gate and the control gate electrode. Recently, embedded EEPROM devices employing single-layered floating gates without control gate electrodes have been developed using complementary metal-oxide-semiconductor (CMOS) technologies which are widely used in various system integrated circuits (ICs). That is, the embedded EEPROM devices employing the single-layered floating gates may be very attractive as nonvolatile memory devices which are capable of being integrated in a system on chip (SOC) that is fabricated using CMOS technologies.

SUMMARY

Various embodiments are directed to nonvolatile memory devices having single-layered floating gates.

According to some embodiments, a nonvolatile memory device includes a first junction protruding from a surface of a substrate, a second junction disposed in the substrate and spaced apart from the first junction, and a floating gate overlapping with a sidewall surface of the first junction and extending to the second junction.

According to further embodiments, a nonvolatile memory device includes a drain mesa protruding from a surface of a substrate. A first source and a second source are disposed in the substrate and spaced apart from the drain mesa. The first source is adjacent to a first sidewall surface of the drain mesa and the second source is adjacent to a second sidewall surface of the drain mesa opposite to the first sidewall surface. A first floating gate overlaps with the first sidewall surface of the drain mesa and extends to the first source. A second floating gate overlaps with the second sidewall surface of the drain mesa and extends to the second source.

According to further embodiments, a nonvolatile memory device includes a plurality of twin cells arrayed in rows and columns provided over a substrate. Each of the twin cells includes a first source and a second source disposed in the substrate, a drain mesa protruding from a surface of the substrate between the first and second sources, a first floating gate overlapping with a first sidewall surface of the drain mesa and extending to the first source adjacent to the first sidewall surface of the drain mesa, and a second floating gate overlapping with a second sidewall surface of the drain mesa and extending onto the second source adjacent to the second sidewall surface of the drain mesa. First source lines are disposed in parallel to the columns, and each of the first source lines is coupled to the first sources of the twin cells arranged along the respective columns. Second source lines are disposed in parallel to the columns, and each of the second source lines is coupled to the second sources of the twin cells arranged along the respective columns. First bit lines are disposed in parallel to the rows, and each of the first bit lines is coupled to the drain mesas of odd-numbered twin cells arranged in the respective rows. Second bit lines are disposed in parallel to the rows, and each of the second bit lines is coupled to the drain mesas of even-numbered twin cells arranged in the respective rows.

According to further embodiments, a nonvolatile memory device includes a plurality of twin cells arrayed over a substrate. Each of the twin cells includes a first source and a second source disposed in the substrate, a drain mesa protruding from a surface of the substrate between the first and second sources, a first floating gate overlapping with a first sidewall surface of the drain mesa, and extending to the first source, and a second floating gate overlapping with a second sidewall surface of the drain mesa and extending to the second source. The first and the second floating gates are arranged opposite to each other with respect to the drain mesa. An isolation layer is disposed in the substrate and separates the first source of a first twin cell among the plurality of twin cells from the second source of a second twin cell among the plurality of twin cells.

According to further embodiments, a nonvolatile memory device includes a drain mesa protruding from a surface of a substrate, a first source and a second source respectively disposed in the substrate and respectively spaced apart from the drain mesa, a first floating gate overlapping with a first sidewall surface of the drain mesa and extending to the first source, a second floating gate overlapping with a second sidewall surface of the drain mesa and extending to the second source, a drain electrode configured to apply a drain voltage to the drain mesa, and a first source electrode and a second source electrode coupled to the first and second sources, respectively, wherein a first memory including the first floating gate and a second memory including the second floating gate, wherein the first and the second memories are separately programmed, erased or read out.

According to further embodiments, a method of fabricating a nonvolatile memory device includes forming a drain mesa protruding from a top surface of a substrate, forming a first floating gate overlapping with a first sidewall surface of the drain mesa and a second floating gate overlapping with a second sidewall surface of the drain mesa, wherein the first and the second floating gate are arranged opposite to each other with respect to the drain mesa, and forming a first source in the substrate spaced apart from the first floating gate and a second source in the substrate spaced apart from the second floating gate.

According to further embodiments, a method fabricating a nonvolatile memory device includes forming a drain mesa that is defined by a recessed portion and protrudes from a surface of a substrate, forming a pair of parallel trenches that are disposed at two sides of the drain mesa, the pair of parallel trenches being deeper than the recessed portion forming isolation layers filling the pair of parallel trenches, forming a first floating gate overlapping with a first sidewall surface of the drain mesa and a second floating gate overlapping with a second sidewall surface of the drain mesa, wherein the second sidewall surface is located opposite to the first sidewall surface of the drain mesa, and forming a first source in the substrate, wherein the first source is spaced apart from the first floating gate, and forming a second source in the substrate, wherein the second source is spaced apart from the second floating gate.

According to further embodiments, a method of fabricating a nonvolatile memory device includes forming a pair of trenches in a substrate, forming isolation layers filling the pair of trenches, selectively etching portions of the substrate between the isolation layers to form recessed portions that define a drain mesa, protruding between the recessed portions, forming a first floating gate overlapping with a first sidewall surface of the drain mesa and a second floating gate overlapping with a second sidewall face of the drain mesa and forming a first source in the substrate to be spaced apart from the first floating gate and a second source in the substrate to be spaced apart from the second floating gate.

According to further embodiments, a nonvolatile memory device comprises first unit cell. The first unit cell includes a common drain provided at a first level, first and second sources provided at a second level that is lower than the first level, a first floating gate vertically extending from the common drain to the first source, and a second floating gate vertically extending from the common drain to the second source.

BRIEF DESCRIPTION OF THE DRAWINGS

Embodiments will become more apparent in view of the attached drawings and accompanying detailed description, in which:

FIG. 8 is a table illustrating a bias condition for operating the cell array shown in FIG. 7;

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments.

It will also be understood that when an element is referred to as being "on," "above," "below," "under," or "beside" another element, it can be directly "on," "above," "below," "under," or "beside" the other element, or intervening elements may also be present. Accordingly, the terms such as "on," "above," "below," "under," or "beside" which are used herein are for the purpose of describing particular embodiments only and are not intended to be limiting.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
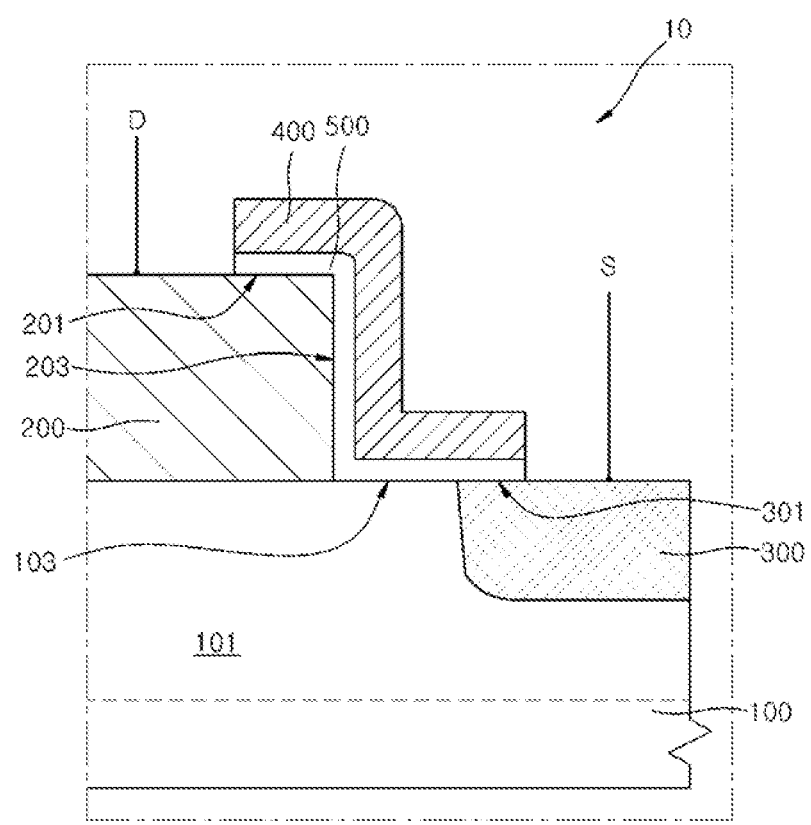
FIG. 1 is a cross-sectional view illustrating a single bit unit cell of a nonvolatile memory device according to an embodiment.
Figure 2:
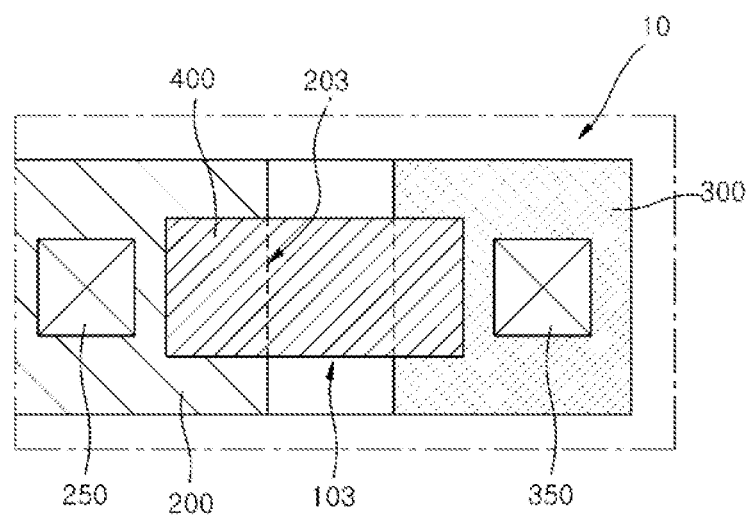
FIG. 2 is a layout diagram illustrating the single bit unit cell shown in FIG. 1.

Referring to FIGS. 1 and 2, a nonvolatile memory device according to an embodiment may include a single bit unit cell 10. The single bit unit cell 10 may be configured to include a drain mesa 200 protruding from a surface of a semiconductor substrate 100 and serving as a first junction, a source 300 disposed in the semiconductor substrate 100, spaced apart from the drain mesa 200 and serving as a second junction, a floating gate 400 overlapping with a top surface 201 and a sidewall surface 203 of the drain mesa 200 and extending onto the source 300, and a dielectric layer 500 disposed between the floating gate 400 and the drain mesa 200 as well as between the floating gate 400 and the semiconductor substrate 100. The unit cell 10 may function as an EEPROM cell.

The drain mesa 200 may protrude from a top surface of the semiconductor substrate 100, such as a silicon substrate, to serve as a first impurity region doped with impurities of a first conductivity type. In some embodiments, an entire portion of the drain mesa 200 may be fully doped with the impurities of the first conductivity type. In such a case, the entire portion of the drain mesa 200 may serve as the first impurity region corresponding to the first junction. Alternatively, only an upper portion and sidewall portions of the drain mesa 200 may be doped with the impurities of the first conductivity type. In such a case, the first impurity region corresponding to the first junction may be disposed along the top surface 201 and the sidewall surfaces 203 of the drain mesa 200. A well region 101 may be disposed in the semiconductor substrate 100. The well region 101 may be doped with impurities of a second conductivity type different from the first conductivity type, and the source 300 may be doped with the impurities of the first conductivity type to serve as a second impurity region. The drain mesa 200 may be disposed on the well region 101, and the source 300 may be disposed in the well region 101. Since the drain mesa 200 and the source 300 are disposed on and in the well region 101, the size of the unit cell 10 may be reduced. A channel region 103 may be defined at a top surface of the well region 101 between the drain mesa 200 and the source 300. A drain electrode 250 ('D' of FIG. 1) may be disposed on the drain mesa 200, and a source electrode 350 ('S' of FIG. 1) may be disposed on the source 300.

The floating gate 400 may be a gate in a single-polysilicon EEPROM cell structure for embedded memory. The floating gate 400 includes a polysilicon layer. The floating gate 400 may be disposed to overlap with the drain mesa 200. Voltage is induced at the floating gate 400 to perform a program operation or an erasure operation when a drain voltage is applied to the drain mesa 200. Accordingly, the floating gate 400 may overlap with the top surface 201 and the sidewall surface 203 of the drain mesa 200 and extend onto the channel region 103 and an edge 301 of the source 300, as described above. Because the drain mesa 200 has an elevated shape protruding from a top surface of the semiconductor substrate 100, an overlap area between the floating gate 400 and the drain mesa 200 may increase as a height of the drain mesa 200 increases. That is, if the height of the drain mesa 200 increases, the overlap area between the floating gate 400 and the drain mesa 200 may increase even without an increase of a planar area of the unit cell 10.

In the event that the height of the drain mesa 200 increases, the overlap area between the floating gate 400 and the drain mesa 200 may increase, thus increasing a coupling capacitance value between the floating gate 400 and the drain mesa 200 even without an increase of a planar area that the unit cell 10 occupies. As a result, if the unit cell 10 is designed to increase the height of the drain mesa 200, the unit cell 10 can be scaled down without degradation of performance.

Figure 3:
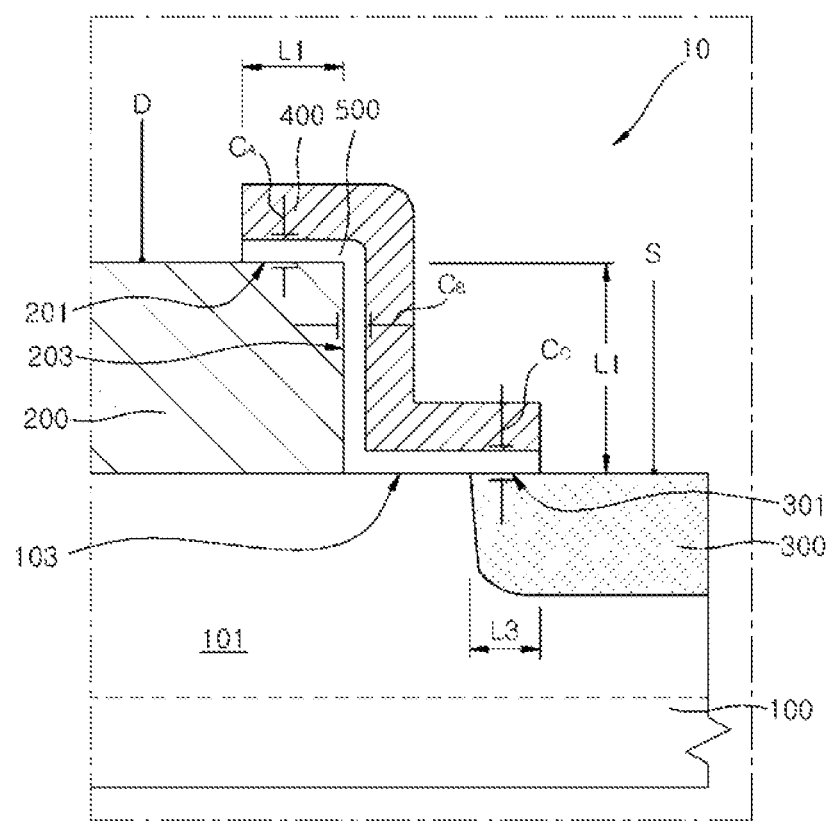
FIG. 3 is a cross-sectional view illustrating the single bit unit cell shown in FIG. 1 together with coupling capacitance components.

Referring to FIG. 3, a first capacitance $C_A$ may exist between the floating gate 400 and the top surface 201 of the drain mesa 200, and a second capacitance $C_B$ may exist between the floating gate 400 and the sidewall surface 203 of the drain mesa 200. Moreover, a third capacitance $C_C$ may exist between the source 300 and the floating gate 400. As illustrated in FIG. 2, the floating gate 400 may have a rectangular shape in a plan view. Thus, the floating gate 400 may have a uniform width. In such a case, the first capacitance $C_A$ may be proportional to a first length L1 of the floating gate 400 overlapping with the top surface 201 of the drain mesa 200, the second capacitance $C_B$ may be proportional to a second length L2 (corresponding to the height of the drain mesa 200) of the floating gate 400 overlapping with the sidewall surface 203 of the drain mesa 200, and the third capacitance $C_C$ may be proportional to a third length L3 of the floating gate 400 overlapping with the source 300. A coupling ratio CR of the unit cell 10 may be approximately expressed by the following equation 1.

$$CR=(C_A+C_B)/(C_A+C_B+C_C) \quad (1)$$

If the first length L1 is 100 nanometers, the second length L2 is 150 nanometers, and the third length is 20 nanometers and the coupling ratio CR of the unit cell 10 may be about 0.957 based on the equation 1. If the second length L2 increases from 150 nanometers to 350 nanometers, the coupling ratio CR of the unit cell 10 may increase from about 0.926 to about 0.957. If the coupling ratio CR of the unit cell 10 is close to '1', a voltage induced at the floating gate 400 may be close to a drain voltage applied to the drain mesa 200.

Accordingly, if the height of the drain mesa 200 increases, the coupling ratio CR of the unit cell 10 may increase and the performance of the unit cell 10 in a given cell area improves.

Figure 4:
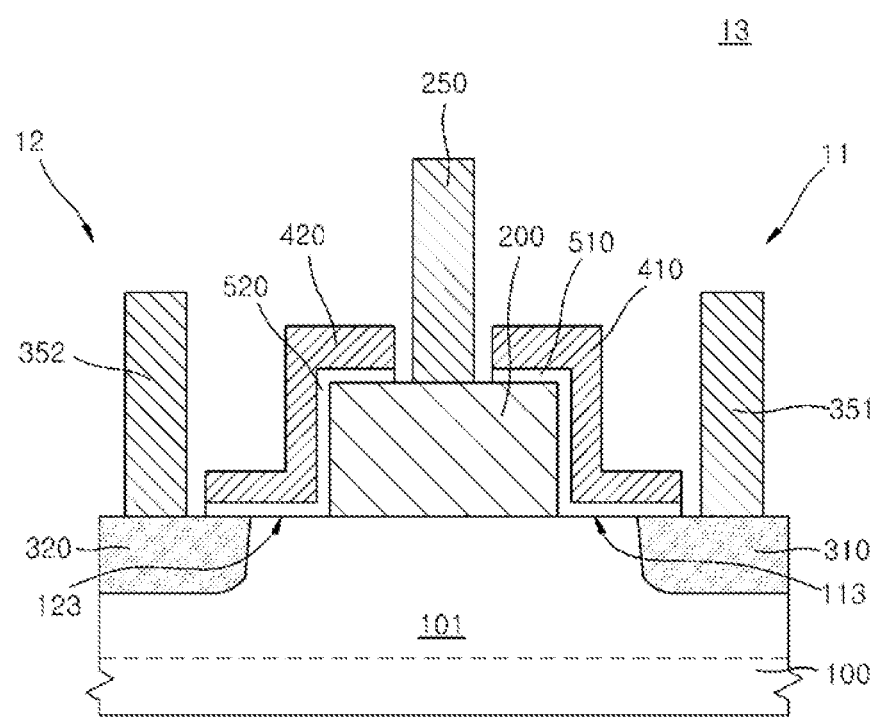
FIG. 4 is a cross-sectional view illustrating a twin cell of a nonvolatile memory device according to an embodiment.
Figure 5:
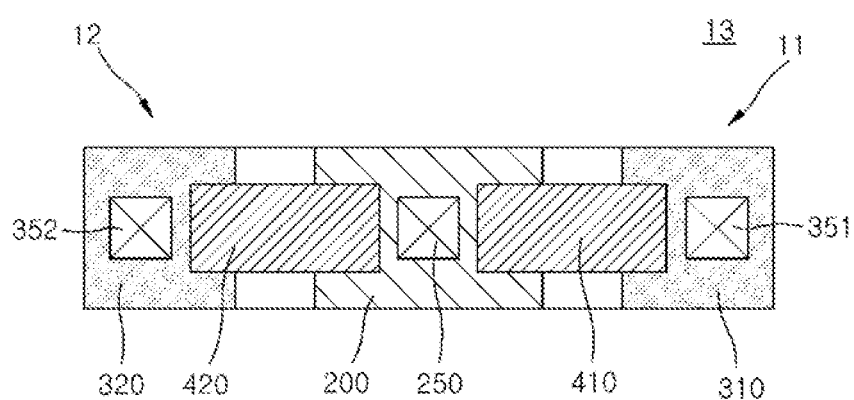
FIG. 5 is a layout diagram illustrating the twin cell shown in FIG. 4.

Referring to FIGS. 4 and 5, a twin cell 13 of the nonvolatile memory device according to an embodiment may include a right unit cell 11 and a left unit cell 12 which are symmetric to each other to share the drain mesa 200. Each of the right unit cell 11 and the left unit cell 12 may have substantially the same structure as the unit cell 10 shown in FIG. 1. Thus, if the unit cell 10 of FIG. 1 can store a single-bit data therein, the twin cell 13 of FIG. 4 may store two-bit data therein using two separate sources 310 and 320. Because the right unit cell 11 and the left unit cell 12 constituting the twin cell 13 share a common drain mesa 200, a size of the twin cell 13 can be reduced.

The twin cell 13 may be configured to include the common drain mesa 200 protruding from a top surface of the semiconductor substrate 100 to serve as a first junction, a first source 310 disposed in the semiconductor substrate 100 and spaced apart from the common drain mesa 200 to serve as a second junction, a second source 320 disposed in the semiconductor substrate 100 opposite to the first source 310 and spaced apart from the common drain mesa 200 to serve as another second junction, a first floating gate 410 overlapping with a right top surface and a right sidewall surface of the common drain mesa 200 and extending onto the first source 310, second floating gate 420 overlapping with a left top surface and a left sidewall surface of the common drain mesa 200 and extending onto the second source 320, a first dielectric layer 510 disposed between the first floating gate 410 and the common drain mesa 200 as well as between the first floating gate 410 and the semiconductor substrate 100, and a second dielectric layer 520 disposed between the second floating gate 420 and the common drain mesa 200 as well as between the second floating gate 420 and the semiconductor substrate 100. The right unit cell 11 and the left unit cell 12 constituting the twin cell 13 may function as EEPROM cells.

The common drain mesa 200 may protrude from the top surface of the semiconductor substrate 100 such as a silicon substrate to serve as a first impurity region doped with impurities of a first conductivity type. In some embodiments, an entire portion of the common drain mesa 200 may be fully doped with the impurities of the first conductivity type. In such a case, the entire portion of the common drain mesa 200 may serve as the first impurity region corresponding to the first junction. Alternatively, only an upper portion and sidewall portions of the common drain mesa 200 may be doped with the impurities of the first conductivity type. In such a case, the first impurity region corresponding to the first junction may be disposed along the top surface and the sidewall surfaces of the common drain mesa 200. The well region 101 may be disposed in the semiconductor substrate 100. The well region 101 may be doped with impurities of a second conductivity type different from the first conductivity type, and the first and second sources 310 and 320 may be doped with the impurities of the first conductivity type to serve as second impurity regions. The common drain mesa 200 may be disposed on the well region 101, and the first and second sources 310 and 320 may be disposed in the well region 101. The common drain mesa 200, the first floating gate 410, the first source 310 and the first dielectric layer 510 may constitute the right unit cell 11, and the common drain mesa 200, the second floating gate 420, the second source 320 and the second dielectric layer 520 may constitute the left unit cell 12. Since the right unit cell 11 and the left unit cell 12 share the well region 101, a size of the twin cell 13 may be reduced.

A first channel region 113 may be defined at a top surface of the well region 101 between the common drain mesa 200 and the first source 310, and a second channel region 123 may be defined at a top surface of the well region 101 between the common drain mesa 200 and the second source 320. A common drain electrode 250 may be disposed on the common drain mesa 200, and first and second source electrodes 351 and 352 may be disposed on the first and second sources 310 and 320, respectively.

The first and second floating gates 410 and 420 may be formed using a single layered conductive material such as a single polysilicon layer. If a drain voltage is applied to the common drain mesa 200 and first and second source voltages are applied to the first and second sources 310 and 320, certain voltages may be induced at the first and second floating gates 400 by a cell coupling ratio (see the equation 1). In such a case, the right unit cell 11 or the left unit cell 12 may be selectively programmed or read out according to first and second source voltages respectively applied to the first and second sources 310 and 320.

As described above, the first floating gate 410 may overlap with the right top surface and the right sidewall surface of the common drain mesa 200 and extend onto the first channel region 113 and an edge of the first source 310, and the second floating gate 420 may overlap with the left top surface and the left sidewall surface of the common drain mesa 200 and extend onto the second channel region 123 and an edge of the second source 320. That is, the first and second floating gates 410 and 420 may be disposed to be symmetric with respect to the common drain mesa 200, and the first and second sources 310 and 320 may also be disposed to be symmetric with respect to the common drain mesa 200.

Because the common drain mesa 200 has an elevated shape protruding from a top surface of the semiconductor substrate 100, overlapping areas between the floating gates 410 and 420 and the common drain mesa 200 may increase as a height of the common drain mesa 200 increases. That is, if the height of the common drain mesa 200 increases, the overlapping areas between the floating gates 410 and 420 and the common drain mesa 200 may increase even without increasing the planar area of the twin cell 13.

In the event that the height of the drain mesa 200 increases, the overlapping, areas between the floating gates 410 and 420 and the common drain mesa 200 may increase, thus increasing coupling capacitance values between the floating gates 410 and 420 and the common drain mesa 200 even without any increase of the planar area that the twin cell 13 occupies. As a result, if the twin cell 13 is designed to increase the height of the common drain mesa 200, the twin cell 13 can be scaled down without degradation of performance thereof.

Figure 6:
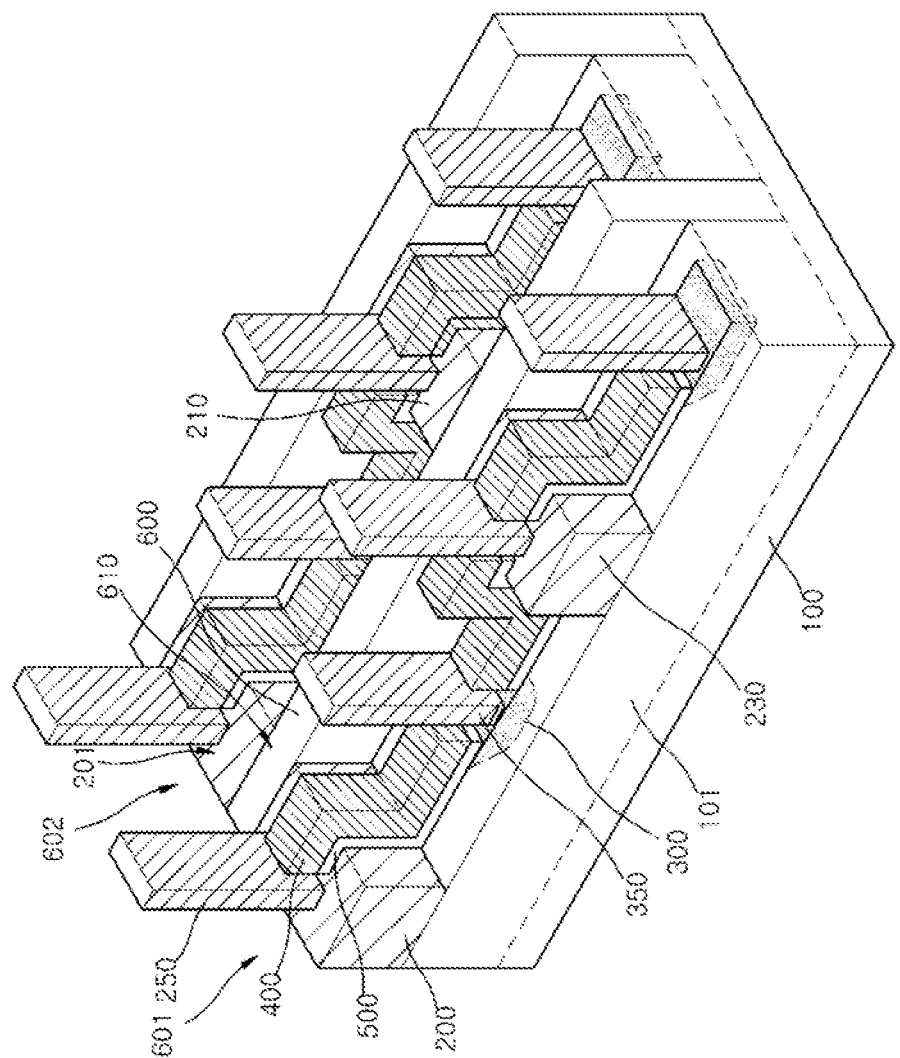
FIG. 6 is a perspective view illustrating a cell array of a nonvolatile memory device including the twin cell shown in FIG. 4.

Referring to FIG. 6, a nonvolatile memory device according to an embodiment may include a plurality of twin cells (13, 16 and 19 of FIG. 7) which are arrayed in rows and columns to have a matrix form. That is, the nonvolatile memory device according to an embodiment may include drain mesas 200 arrayed in a matrix form on a substrate 100 to protrude from a surface of the substrate 100, sources 300 disposed in the substrate 100 between the drain mesas 200 arrayed in each row, and floating gates 400 overlapping with both sidewall surfaces of each drain mesa 200 in each row and extending onto the adjacent sources 300. As illustrated in FIGS. 4 and 5, each of the twin cells may have a symmetric structure in which a pair of sources (310 and 320 of FIG. 4) are disposed to be symmetric with respect to the drain mesa 200 and a pair of floating gates (410 and 420 of FIG. 4) are disposed to be symmetric with respect to the drain mesa 200.

Figure 7:
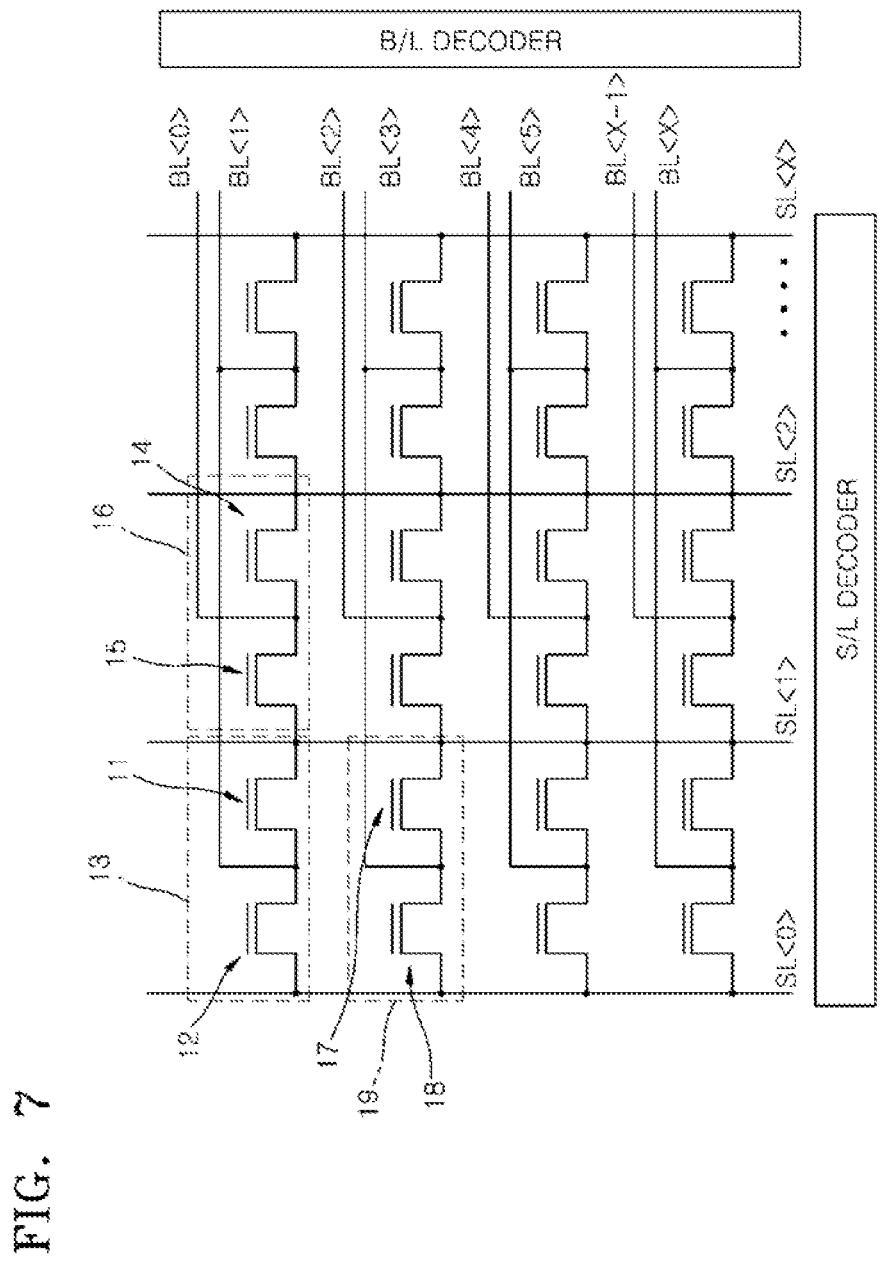
FIG. 7 illustrates a configuration of a nonvolatile memory device including an equivalent circuit diagram of the cell array shown in FIG. 6.

Referring to FIG. 7, a pair of twin cells (for example, 13 and 16) adjacent to each other in a row may share one of the sources 300, as illustrated in FIG. 6. In addition, the drain mesas 200 of odd-numbered twin cells arrayed in each row may be electrically connected to a bit line BL<0>, BL<2>, BL<4>, . . . or BL<X−1>, and the drain mesas 200 of even-numbered twin cells arrayed in each row may be electrically connected to a bit line BL<1>, SL<3>, BL<5>, . . . or BL<X>. The bit lines BL<0>, BL<1>, BL<2>, BL<3>, BL<4>, BL<5>, . . . , BL<X−1> and BL<X> may be disposed to be parallel with rows and may be connected to a bit line (B/L) decoder. Although the pair of adjacent twin cells (for example, 13 and 16) in each row share one of the sources 300 the pair of adjacent twin cells (for example, 13 and 16) in each row may independently operate because the drain mesas 200 of the pair of adjacent twin cells (for example, 13 and 16) in each row are respectively connected to two different bit lines (for example, BL<0> and BL<1>).

First sources of the twin cells (including the twin cells 13 and 19) arrayed in a first column may be electrically connected to a source line SL<0>, and second sources of the twin cells (including the twin cells 13 and 19) arrayed in the first column may be electrically connected to a source line SL<1>. In addition, first sources of the twin cells (including the twin cell 16) arrayed in a second column may be electrically connected to the source line SL<1>, and second sources of the twin cells (including the twin cell 16) arrayed in the second column may be electrically connected to a source line SL<2>. Moreover, first sources of the twin cells arrayed in an $X^{th}$ column may be electrically connected to the source line SL<X−1>, and second sources of the twin cells arrayed in the $X^{th}$ column may be electrically connected to a source line SL<X>. The source lines SL<0>, SL<1>, SL<2>, . . . and SL<X> may be disposed to be parallel with columns and may be connected to a source line (S/L) decoder. The source line (S/L) decoder may be disposed to be connected to the source lines SL<0>, SL<1>, SL<2>, . . . and SL<X>, and the bit line decoder may be disposed to be connected to the bit lines BL<0>, BL<1>, BL<3>, BL<4>, BL<5>, . . . , BL<X−1> and BL<X>. The bit lines are arranged perpendicular to the source lines SL<0>, SL<1>, SL<2>, . . . and SL<X>.

Referring again to FIG. 6 the twin cells arrayed in a first row 601 may share a well region 101, and the twin cells arrayed in a second row 602 may share another well region 101 which is separated from the well region 101 in the first row 601 by an isolation layer 600, such as a shallow trench isolation (STI) layer. The sources 300 of the win cells arrayed in the first row 601 may also be separated from the sources 300 of the twin cells arrayed in the second row 602 by the isolation layer 600. The sources 300 may be electrically connected to the source lines SL<0>, SL<1>, SL<2>, . . . and SL<X> which are connected to the source line (S/L) decoder. In some embodiments, the isolation layer 600 may extend to isolate the twin cells from each other in consideration of a high voltage applied to the sources 300.

The isolation layer 600 may have a top surface 610 which is substantially level with the top surfaces 201 of the drain mesas 200. The isolation layer 600 may extend into the semiconductor substrate 100 to a sufficient depth to separate a well region 101 in the first row and a well region 101 in the second row from each other.

Referring to FIGS. 4 and 7, the twin cell 13 may include the drain electrode 250 through which a drain voltage is applied to the drain mesa 200 and the first and second source electrodes 351 and 352 for applying two different source voltages to the first and second, sources 310 and 320 to selectively program, read or erase any one of the right and left unit cells 11 and 12. The unit cells 11, 12, 14, 15, 17 and 18 constituting the twin cells 13, 16 and 19 may selectively operate by applying various voltages to the drain electrodes 250 (e.g., the bit lines BL<0>, BL<1> and BL<2>) and the first and second source electrodes 351 and 352 (e.g., the source lines SL<0>, SL<1> and SL 2>), as listed in the table of FIG. 8.

Referring to FIGS. 4, 7 and 8, a first program operation PGM1 for selectively programming the left unit cell 12 of the twin cell 13 may be performed by applying a positive program voltage (e.g., +Vpp corresponding to a bit line voltage VBL or a drain voltage) to the bit line BL<1> which is connected to the common drain mesa 200 of the twin cell 13, applying a ground voltage corresponding to a second source line voltage VSL0 to the source line SL<0>, which is connected to the second source 320 of the left unit cell 12 of the twin cell 13, floating the source line SL<1> connected to the first source 310 of the right unit cell 11 of the twin cell 13, and applying a ground voltage corresponding to a well voltage Vwell to the well region 101.

Under the above bias condition for the first program operation PGM1, the left unit cell 12 of the twin cell 13 may be programmed by a hot carrier injection (HCI) mechanism. Specifically, a high voltage close to the positive program voltage +Vpp may be induced at the second floating gate 420 of the left unit cell 12 of the twin cell 13 by a cell coupling ratio of the left unit cell 12, and channel hot electrons may be generated in the second channel region 123 of the left unit cell 12 and may be injected into the second floating gate 420 of the left unit cell 12 to selectively program the left unit cell 12. That is, if the positive program voltage +Vpp is applied to the common drain mesa 200 of the twin cell 13 and the second source 320 of the left unit cell 12 is grounded, a high voltage may be induced at the second floating gate 420 of the left unit cell 12 by the cell coupling ratio of the left unit cell 12 to form an inversion channel in the second channel region 123 of the left unit cell 12 and hot carriers (e.g., hot electrons) may be generated in the well region 101 adjacent to the common drain mesa 200 by an electric field created between the common drain mesa 200 and the second source 320 and may be injected into the second floating gate 420 of the left unit cell 12 by an electric field created between the second floating gate 420 and the well region 101.

A second program operation PGM2 for selectively programming the right unit cell 11 of the twin cell 13 may be performed by applying a positive program voltage +Vpp corresponding to the bit line voltage VBL or the drain voltage to the bit line BL<1> which is connected to the common drain mesa 200 of the twin cell 13, floating the source line SL<0> connected to the second source 320 of the left unit cell 12 of the twin cell 13, applying a ground voltage corresponding to a first source line voltage VSL1 to the source line SL<1> which is connected to the first source 310 of the right unit cell 11 of the twin cell 13, and applying a ground voltage corresponding to the well voltage Vwell to the well region 101.

Erasure operations for erasing the data stored in the unit cells 11 and 12 may be independently performed using a Fowler-Nordheim (F-N) tunneling mechanism. That is, if a high source voltage is applied to a selected source of the right and left unit cells 11 or 12 and the common drain mesa 200 is grounded, hot holes may be injected into the floating gate of the selected unit cell. For example, a first erasure operation ERS1 for selectively erasing the left unit cell 12 of the twin cell 13 may be performed by applying a ground voltage corresponding to the bit line voltage VBL to the bit line BL<1> which is connected to the common drain mesa 200 of the twin cell 13, applying a positive erasure voltage Vpp corresponding to the second source line voltage VSL0 to the source line SL<0> which is connected to the second source 320 of the left unit cell 12 of the twin cell 13, floating the source line SL 1> connected to the first source 310 of the right unit cell 11 of the twin cell 13, applying a ground voltage corresponding to the well voltage Vwell to the well region 101. A second erasure operation ERS2 for selectively erasing the right unit cell 11 of the twin cell 13 may be performed by applying a ground voltage corresponding to the bit line voltage VBL to the bit line BL<1> which is connected to the common drain mesa 200 of the twin cell 13, floating the source line SL<0> connected to the second source 320 of the left unit cell 12 of the twin cell 13 applying the positive erasure voltage Vpp corresponding to the first source line voltage VSL1 to the source line SL<1> which is connected to the first source 310 of the right unit cell 11 of the twin cell 13, and applying a ground voltage corresponding to the well voltage Vwell to the well region 101.

A read operation may be performed by applying a read voltage Vread to the drain mesa 200 of a selected twin cell and applying a source voltage to any one selected from the first and second sources 310 and 320 of the selected twin cell. For example, a first read operation READ1 for selectively reading out the data stored in the left unit cell 12 of the twin cell 13 may be performed by applying the read voltage Vread corresponding to the bit line voltage VBL to the bit line BL<1> connected to the common drain mesa 200 of the twin cell 13 to induce a voltage at the second floating gate 420 of the twin cell 13, floating the source line SL<1> connected to the first source 310 of the right unit cell 11 of the twin cell 13, applying a source voltage Vss corresponding to the second source line voltage VSL0 to the source line SL<0> which is connected to the second source 320 of the left unit cell 12 of the twin cell 13, and applying a ground voltage corresponding to the well voltage Vwell to the well region 101. In such a case, if the left unit cell 12 is a programmed cell, no inversion channel is formed in the second channel region 123 to turn off the left unit cell 12. Thus, no current flows through the left unit cell 12. On the contrary, if the left unit cell 12 is an erased cell, an inversion channel may be formed in the second channel region 123 to turn on the left unit cell 12. Thus, a current may flow through the left unit cell 12 and the bit line BL<1>.

A second read operation READ2 for selectively reading out the data stored in the right unit cell 11 of the twin cell 13 may be performed by applying the read voltage Vread corresponding to the bit line voltage VBL to the bit line BL<1> connected to the common drain mesa 200 of the twin cell 13 to induce a voltage at the first floating gate 410 of the twin cell 13, applying the source voltage Vss corresponding to the first source line voltage VSL1 to the source line SL<1> which is connected to the first source 310 of the right unit cell 11 of the twin cell 13, floating the source line SL<0> connected to the second source 320 of the left unit cell 12 of the twin cell 13, and applying a ground voltage corresponding to the well voltage Vwell to the well region 101. In such a case, if the right unit cell 11 is a programmed cell, no inversion channel is formed in the first channel region 113 to turn off the right unit cell 11. Thus, no current flows through the right unit cell 11. On the contrary, if the right unit cell 11 is an erased cell, an inversion channel may be formed in the first channel region 113 to turn on the right unit cell 11. Thus, a current may flow through the right unit cell 11 and the bit line BL<1>.

As described above, any one of the right and left unit cells constituting a single twin cell (e.g., the twin cell 13) may be selectively programmed, erased or read out using the voltage bias conditions listed in the table of FIG. 8. In addition, as illustrated in FIG. 7, any one of the first twin cell 13 and the second twin cell 16 arrayed to be adjacent to each other in a row may be selected by selecting one of the bit lines BL<0>, BL<1>, BL<2>, BL<3>, BL<4>, BL<5>, . . . , BL<X−1> and BL<X> and selecting one of the source lines SL<0>, SL<1>, SL<2>, . . . and L<X>. Similarly, any one of the first twin cell 13 and the third twin cell 19 arrayed to be adjacent to each other in a column may be selected by selecting one of the bit lines BL<0>, BL<1>, BL<2>, BL<3>, BL<4>, BL<5>, . . . , BL<X−1> and BL<X> and selecting one of the source lines SL<0>, SL<1>, SL<2>, . . . and SL<X>.

Referring again to FIG. 4, a method of fabricating a nonvolatile memory device according to an embodiment may include forming the drain mesa 200 protruding from a surface of the substrate 100, forming the first and second floating gates 410 and 420 respectively overlapping with both sidewall surfaces of the drain mesa 200, and forming the first and second sources 310 and 320 in the substrate 100 adjacent to the first and second floating gates 410 and 420. The first and second floating gates 410 and 420 may be formed to extend onto the top surface of the drain mesa 200. The first and second floating gates 410 and 420 may be formed to be symmetric with respect to the drain mesa 200, and the first and second sources 310 and 320 may also be formed to be symmetric with respect to the drain mesa 200.

Figure 9:
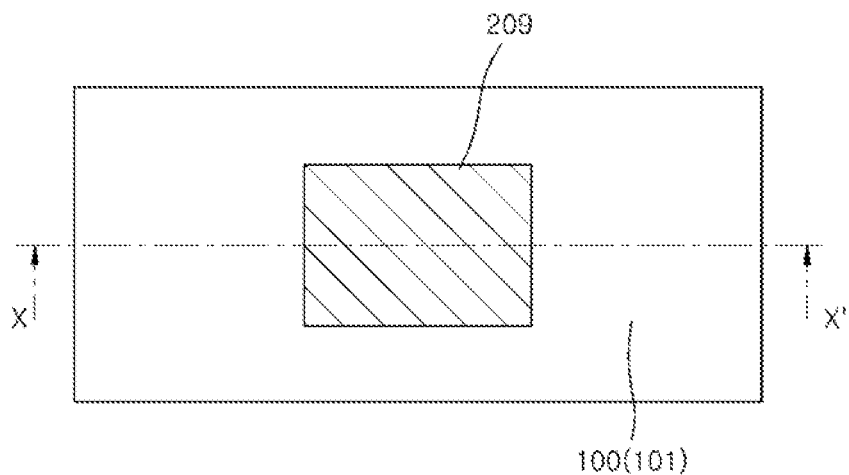
FIGS. 9 to 29 illustrate a method of fabricating nonvolatile memory device according to an embodiment.
Figure 10:
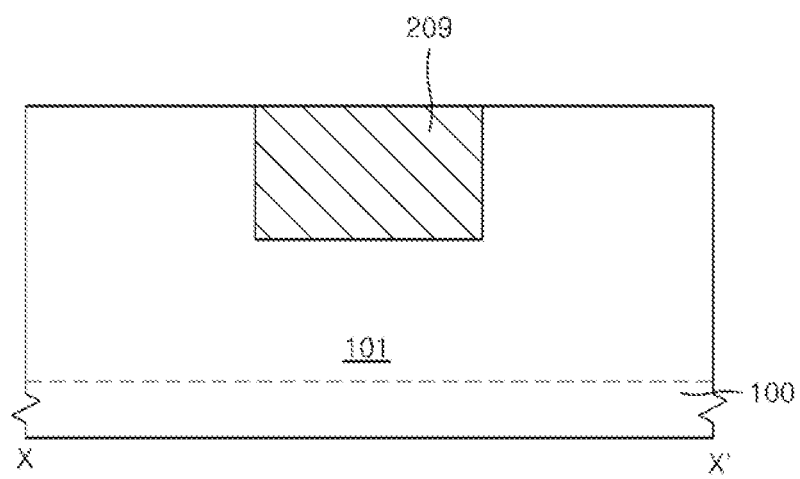

FIG. 9 is a plan view illustrating a first impurity region 209 in a well region 101 of a substrate 100, such as a semiconductor substrate, and FIG. 10 is a cross-sectional view taken along a line X-X' of FIG. 9. Referring to FIGS. 9 and 10, the well region 101 may be formed by implanting impurities of a second conductivity type into the substrate 100, and the first impurity region 209 may be formed by implanting impurities of a first conductivity type into the well region 101. The first impurity region 209 may correspond to a drain mesa which is defined in a subsequent process.

Figure 11:
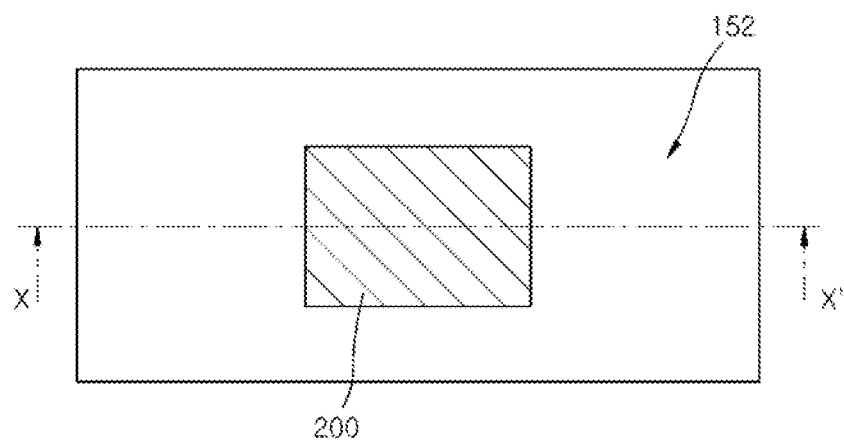
Figure 12:
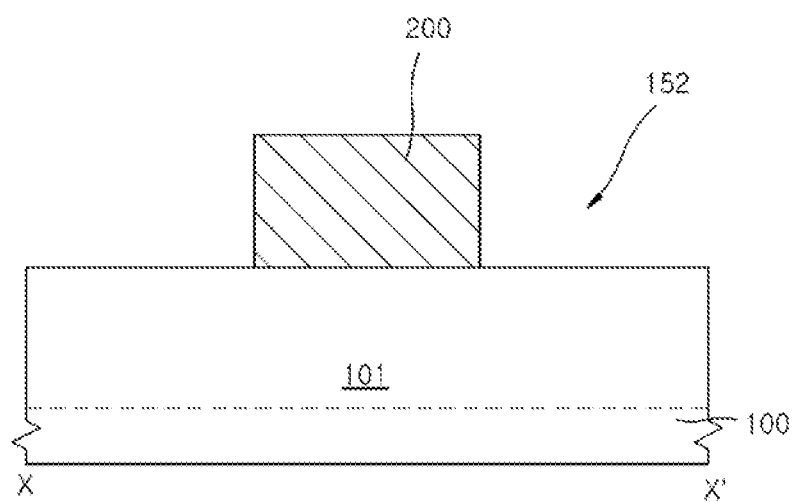

FIG. 11 is a plan view illustrating a drain mesa 200 on the substrate 100, and FIG. 12 is a cross-sectional view taken along a line X-X' of FIG. 11. Referring to FIGS. 11 and 12, the substrate 100 may be recessed to relatively protrude the first impurity region 209 serving as the drain mesa 200 that corresponds to a first junction. Specifically, the substrate 100 may be selectively etched to expose sidewalls of the drain mesa 200. That is, the drain mesa 200 protruding from a surface of the substrate 100 may be formed by recess rig the substrate 100 using a selective etch process to form a first recessed portion 152. However in some embodiments, the drain mesa 200 may be formed by growing a portion of the substrate using an epitaxial growth process.

Figure 13:
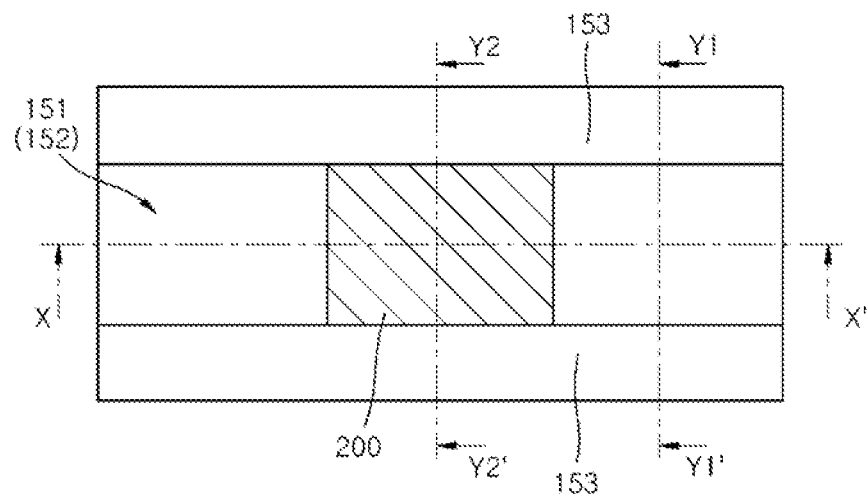
Figure 14:
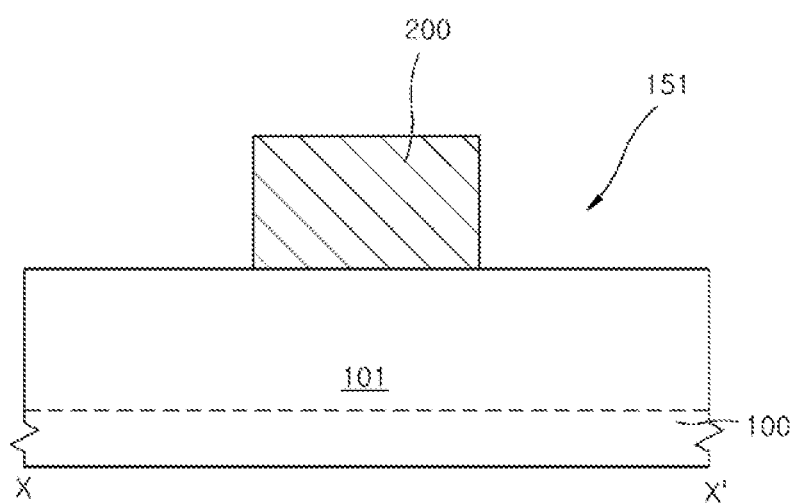
Figure 15:
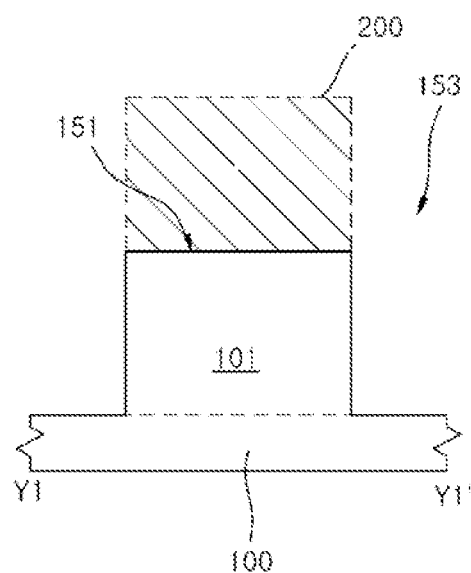
Figure 16:
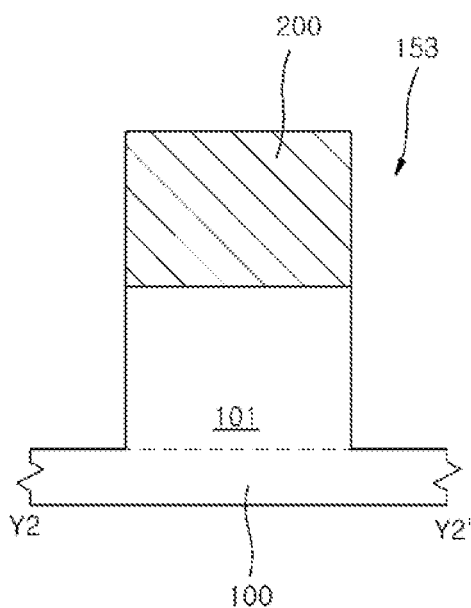

FIG. 13 is a plan view illustrating trenches 153 formed in the substrate 100, and FIG. 14 is a cross-sectional view taken along a line X-X' of FIG. 13. In addition, FIG. 15 is a cross-sectional view taken along a line Y1-Y1' of FIG. 13, and FIG. 16 is a cross-sectional view taken, along a line Y2-Y2' of FIG. 13. Referring to FIGS. 13, 14, 15 and 16, the substrate 100, that is, the well region 101 may be etched to form a pair of parallel trenches 153 at both sides of the drain mesa 200. The trenches 153 may be formed to have a depth which is sufficient to expose the substrate 100 under the well region 101. As illustrated in FIG. 6, the trenches 101 may be formed to divide the single well region 101 into a plurality of portions which are arrayed in the rows 601 and 602. The trenches 153 may be located at both sides of the drain mesa 200, and channel regions and sources may be formed under a bottom surface 151 of the first recessed portion 152 between the trenches 153 in a subsequent process. As described above, the trenches 153 may be formed after formation of the first recessed portion 152 using a dual shallow trench isolation (STI) technique. However, in some embodiments, the first recessed portion 152 may be formed after formation of the trenches 153 using the dual STI technique. A total depth of the trenches 153 from a top surface of the drain mesa 200 may be over twice the thickness of the first recessed portion 152.

Figure 17:
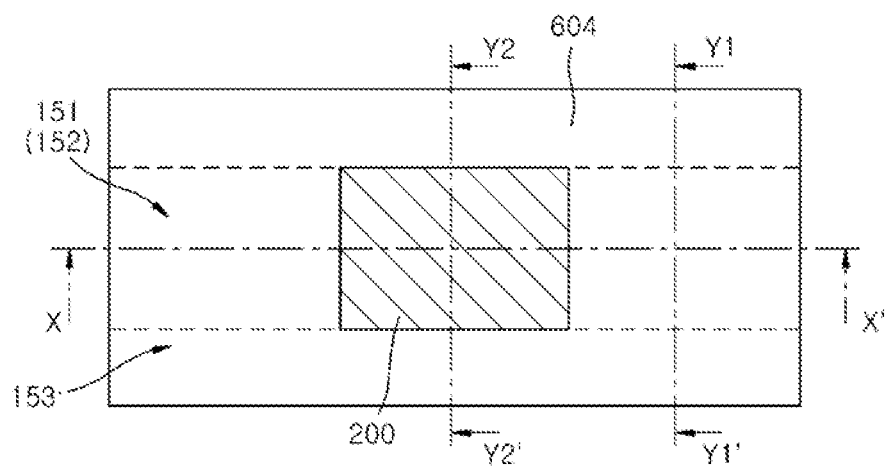
Figure 18:
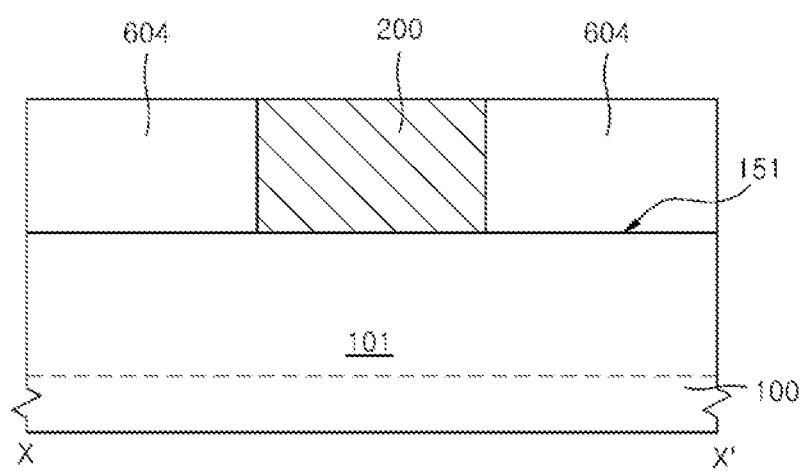
Figure 19:
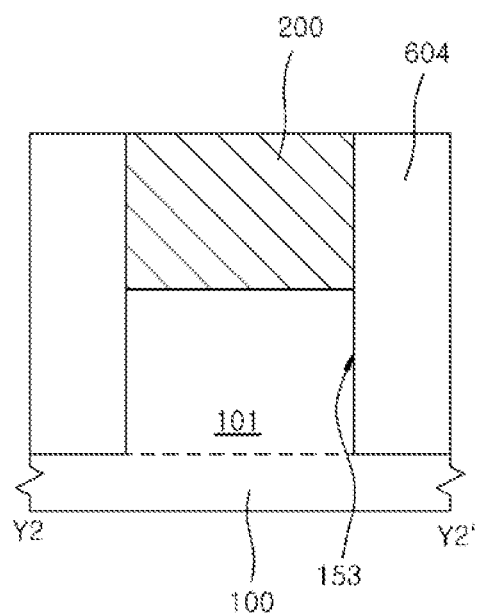

FIG. 17 is a plan view illustrating an insulation layer 604 filling the trenches 153 and the first recessed portion 152. FIG. 18 is a cross-sectional view taken along a line X-X' of FIG. 17 and FIG. 19 is a cross-sectional view taken along a line Y2-Y2' of FIG. 17. Referring to FIGS. 17, 18 and 19, an insulation material may be deposited or coated to fill the trenches 153 and the first recessed portion 152 and to cover the drain mesa 200. The insulation material may then be planarized to expose a top surface of the drain mesa 200. As a result of the planarization process, the insulation layer 604 may be formed in the trenches 153 and the first recessed portion 152.

Figure 20:
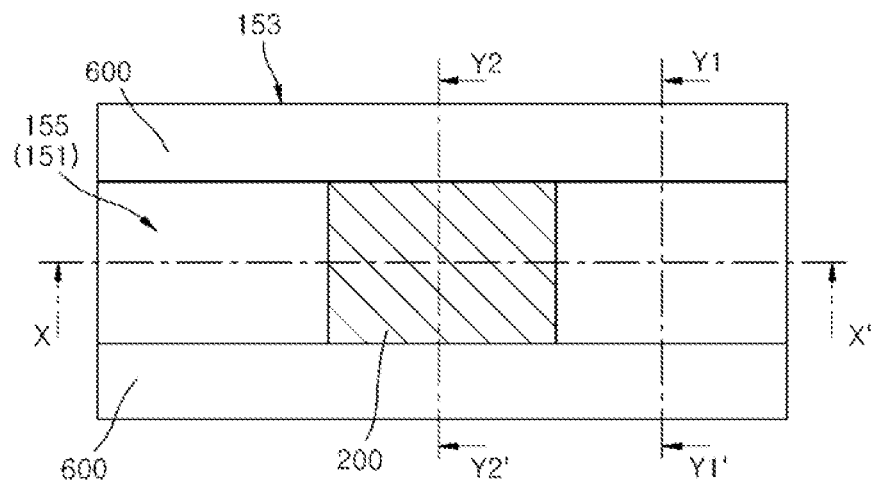
Figure 21:
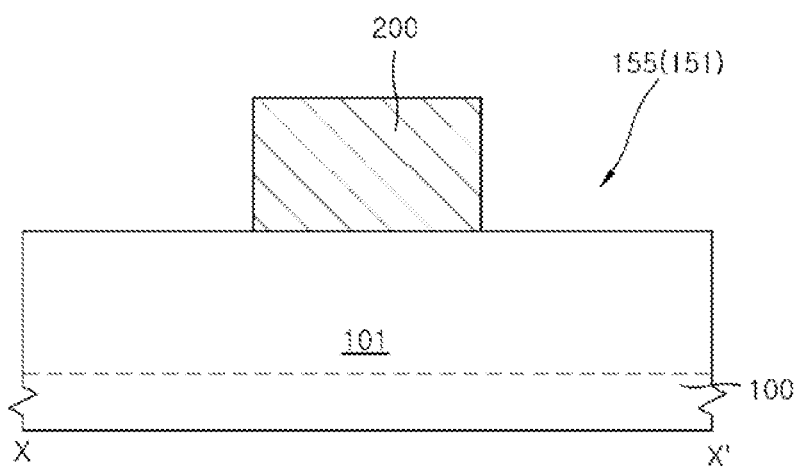
Figure 22:
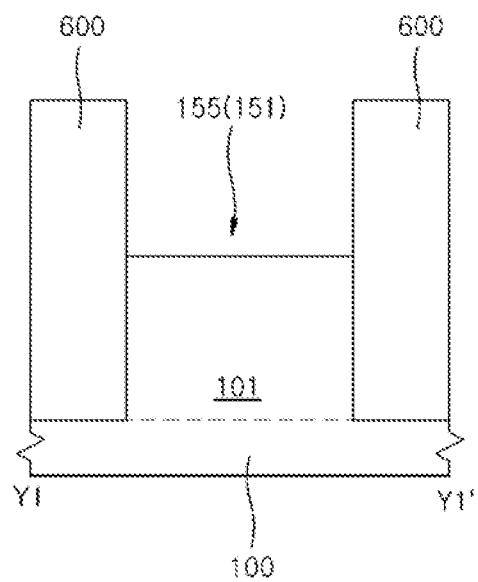
Figure 23:
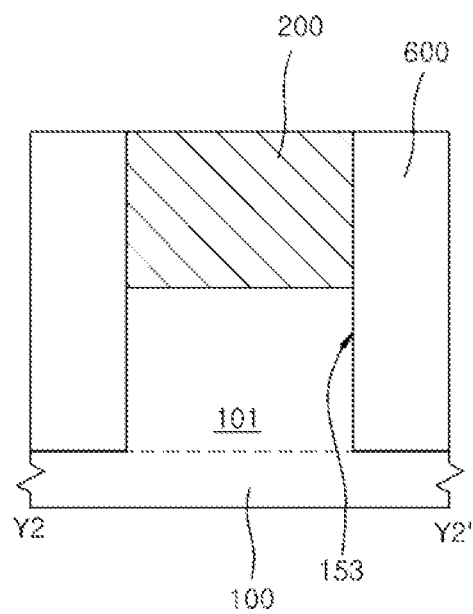

FIG. 20 is a plan view illustrating an isolation layer 600, and FIG. 21 is a cross-sectional view taken along a line X-X' of FIG. 20. In addition FIG. 22 is a cross-sectional view taken along a line Y1-Y1' of FIG. 20, and FIG. 23 is a cross-sectional view taken along a line Y2-Y2' of FIG. 20. Referring to FIGS. 20, 21, 22 and 23, the insulation layer 604 in the first recessed portion 152 may be selectively removed, leaving the isolation layer 600 in the trenches 153. As a result, the bottom surface 151 of the first recessed portion 152 between the trenches 153 may be exposed after the isolation layer 600 is formed. The insulation layer 604 in the first recessed portion 152 may be selectively removed using an etch process. If the insulation layer 604 in the first recessed portion 152 is selectively removed, both sidewall surfaces of the drain mesa 200 between the adjacent isolation layers 600 may be exposed, as illustrated in FIG. 21. In some embodiments, after the well region 101 and the first impurity region 209 of FIG. 10 are formed, the well region 101 may be etched to form the trenches 153 of FIGS. 13, 15 and 16 and the isolation layers 600 may then be formed in the trenches 153. Subsequently, portions of the well region 101 between the isolation layers 600 may be recessed to form recessed portions 155 exposing both sidewalls of the drain mesa 200, as illustrated in FIG. 21.

Figure 24:
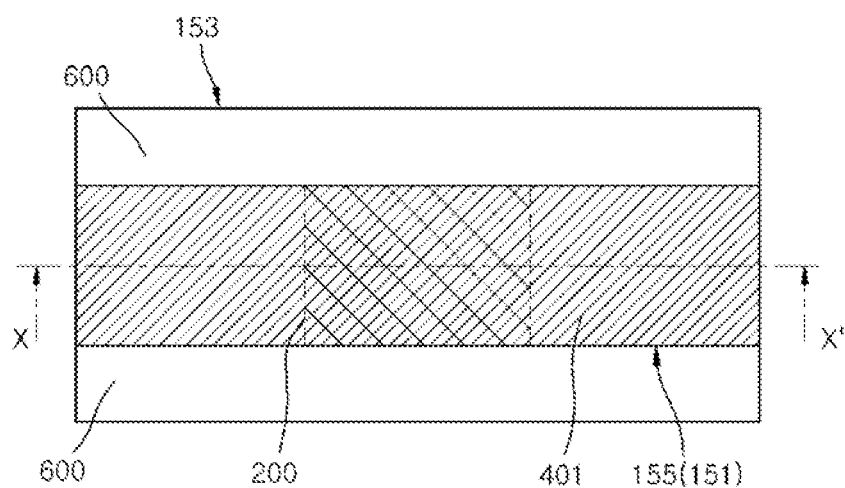
Figure 25:
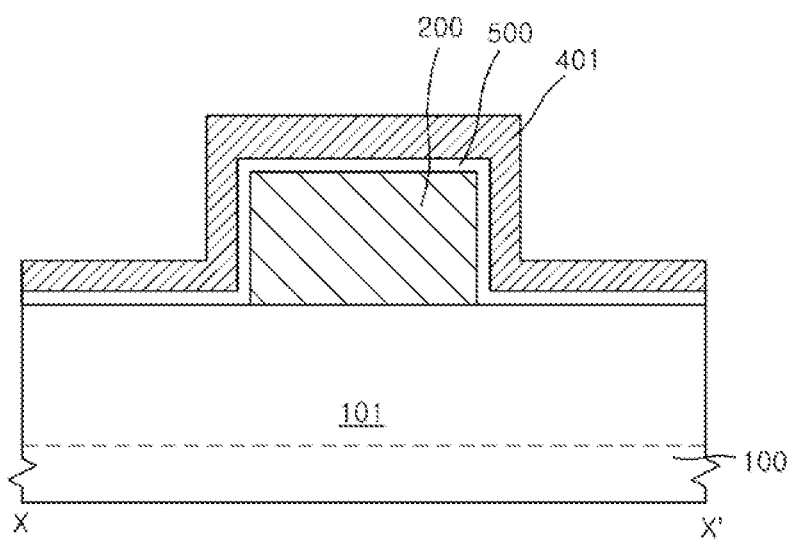

FIG. 24 is a plan view illustrating a floating gate layer 401, and FIG. 25 is a cross-sectional view taken along a line X-X' of FIG. 24. Referring to FIGS. 24 and 25, the floating gate layer 401, for example, a conductive layer such as a doped polysilicon layer may be formed to cover the exposed surfaces of the drain mesa 200 and bottom surfaces of the recessed portions 155. A dielectric layer 500 serving as a gate dielectric layer may be formed on the exposed surfaces of the drain mesa 200 and the bottom surfaces of the recessed portions 155 before the floating gate layer 401 is formed.

Figure 26:
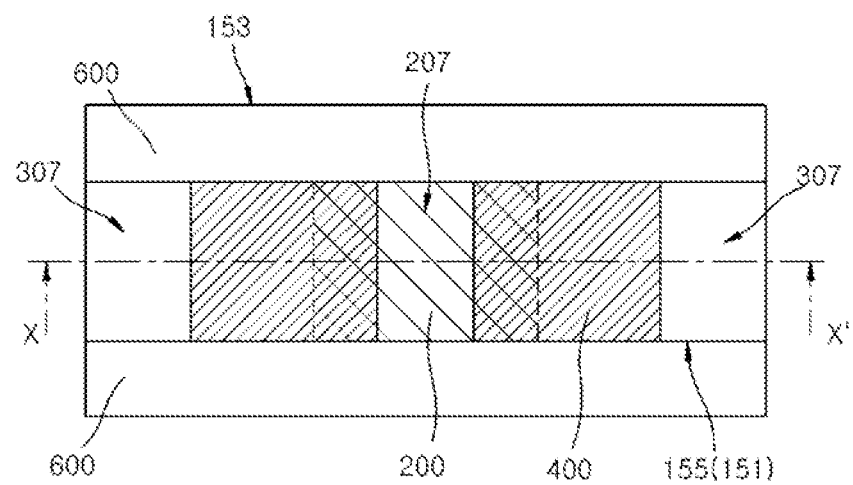
Figure 27:
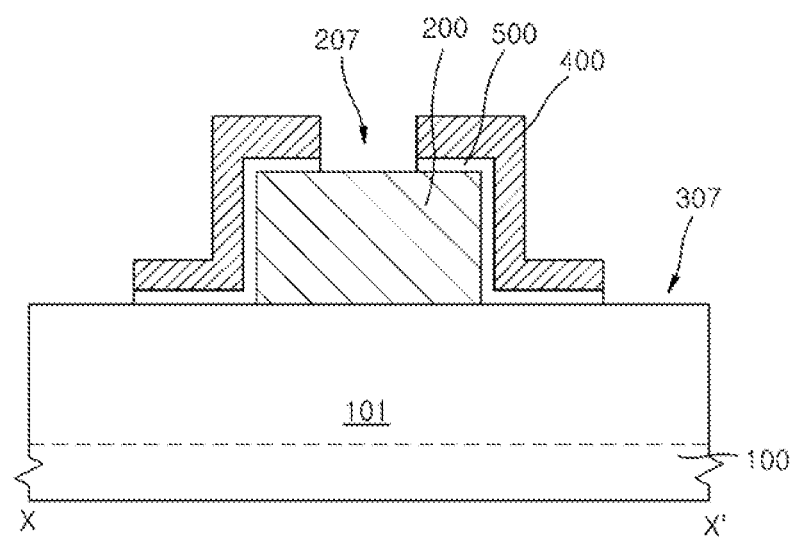

FIG. 26 is a plan view illustrating floating gates 400, and FIG. 27 is a cross-sectional view taken along, a line X-X' of FIG. 26. Referring to FIGS. 26 and 27, the floating gate layer 401 and the dielectric layer 500 may be patterned to form a pair of separate floating gates 400. The floating gate layer 401 and the dielectric layer 500 may be patterned to expose a central portion 207 of the drain mesa 200 and portions 307 of the well region 101. The central portion 207 of the drain mesa 200 may contact a drain electrode which is formed in a subsequent process and sources may be formed in the portions 307 of the well region 101 in a subsequent process.

Figure 28:
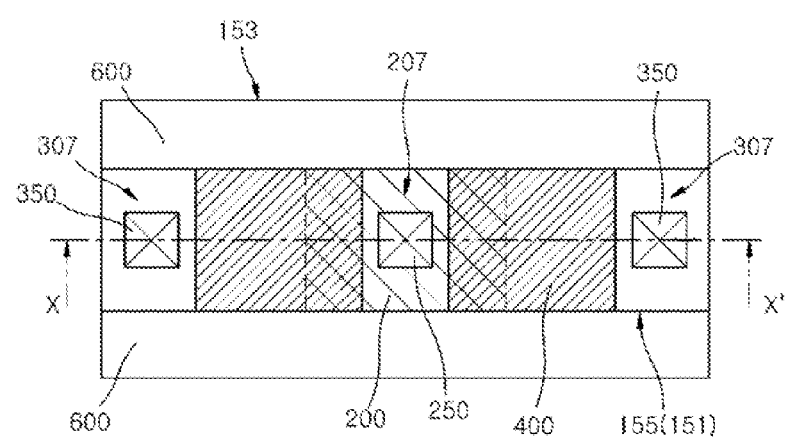
Figure 29:
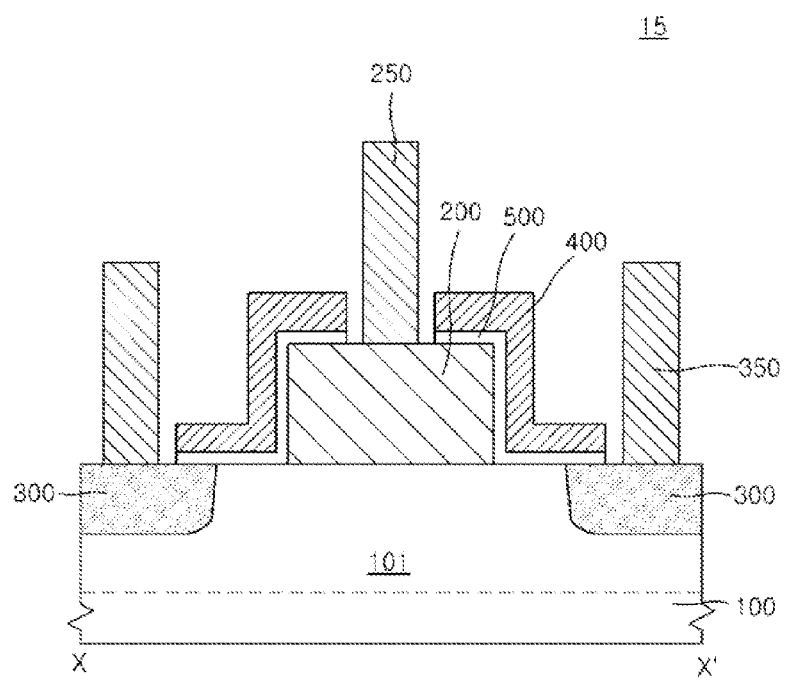

FIG. 28 is a plan view illustrating sources 300, and FIG. 29 is a cross-sectional view taken along a line X-X' of FIG. 28. Referring to FIGS. 28 and 29, impurity ions may be implanted into a portion 207 of the drain mesa 200 and portions 307 of the region 101, thereby forming a pair of sources 300 in the well region 101 and a drain in the drain mesa 200. Subsequently, a drain electrode 250 may be formed on the portion 207 of the drain mesa 200, and a pair of source electrodes 350 may be formed on the respective sources 300.

FIGS. 30 to 37 are plan views and cross-sectional views illustrating a method of fabricating a nonvolatile memory device according to another embodiment of the inventive concept.

Figure 30:
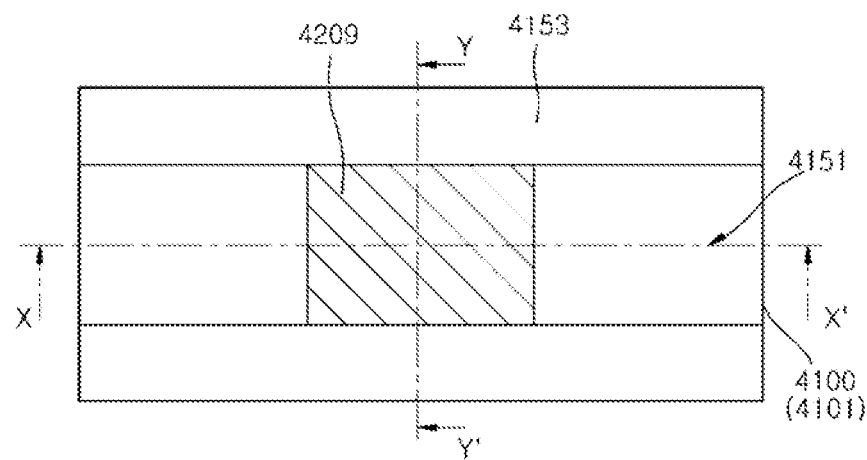
FIGS. 30 to 37 illustrate a method of fabricating a nonvolatile memory device according to another embodiment.
Figure 31:
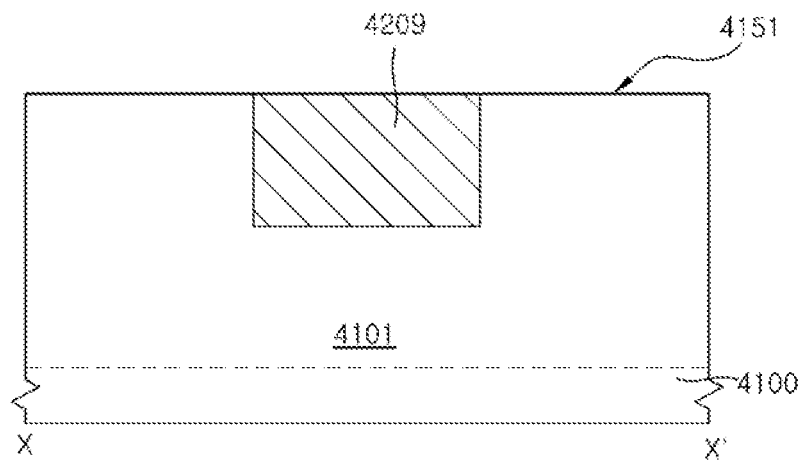
Figure 32:
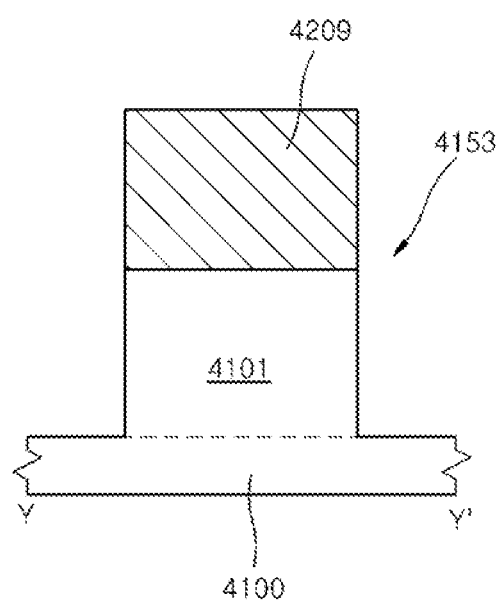

FIG. 30 is a plan view illustrating a well region 4101, first impurity region 4209 and trenches 4153. FIG. 31 is a cross-sectional view taken along a line X-X' FIG. 30, and FIG. 32 is a cross-sectional view taken along a line V-V' of FIG. 30. Referring to FIGS. 30, 31 and 32, the well region 4101 may be formed by implanting impurities of a second conductivity type into a substrate 4100 such as a semiconductor substrate and the first impurity region 4209 may be formed by implanting impurities of a first conductivity type into the well region 4101. The first impurity region 4209 may correspond to a drain mesa which is defined in a subsequent process.

The substrate 4100 including the well region 4101 may be etched to form the pair of parallel trenches 4153 at both sides of the first impurity region 4209. The pair of parallel trenches 4153 may be formed such that surface portions 4151 of the well region 4101 and the first impurity region 4209 are disposed between the parallel trenches 4153. The trenches 4153 may be formed to have a depth which is sufficient to expose the substrate 4100 under the well region 4101. Thus, both sidewall surfaces of the first impurity region 4209 and both sidewall surfaces of the well region 4101 remaining between the pair of parallel trenches 4153 may be exposed by the pair of parallel trenches 4153. In addition, the well region 4101 remaining between the pair of parallel trenches 4153 may be isolated by the pair of parallel trenches 4153.

Figure 33:
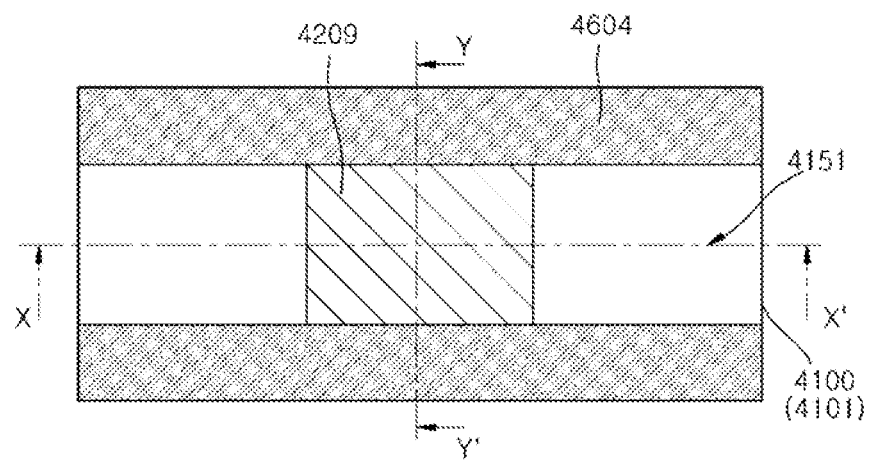
Figure 34:
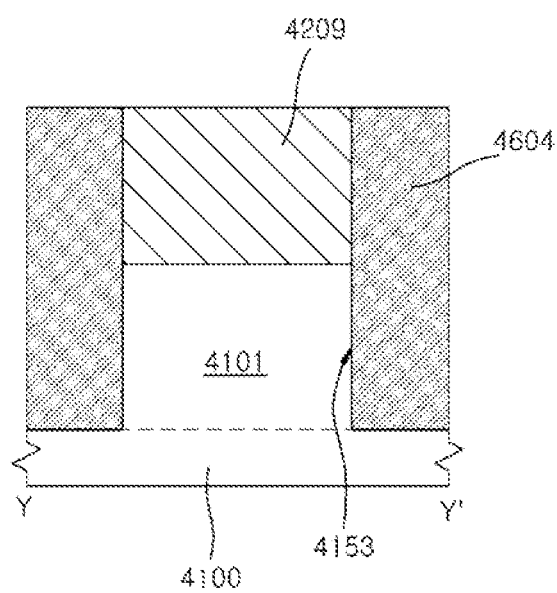

FIG. 33 is a plan view illustrating an insulation layer 4604 filling the trenches 4153, and FIG. 34 is a cross-sectional view taken along a line Y-Y' of FIG. 33. Referring to FIGS. 33 and 34, an insulation material may be deposited or coated to fill the trenches 4153 and to cover the first impurity region 4209. The insulation material may then be planarized to expose a top surface of the first impurity region 4209. As a result of the planarization process, the insulation layers 4604 may be formed in the respective trenches 4153. The planarization process may be performed using a chemical mechanical polishing (CMP) process or an etch-back process. The insulation layers 4604 may correspond to isolation layers. In some embodiments, the first impurity region 4209 may be formed after the insulation layers 4604, that is, the isolation layers are formed.

Figure 35:
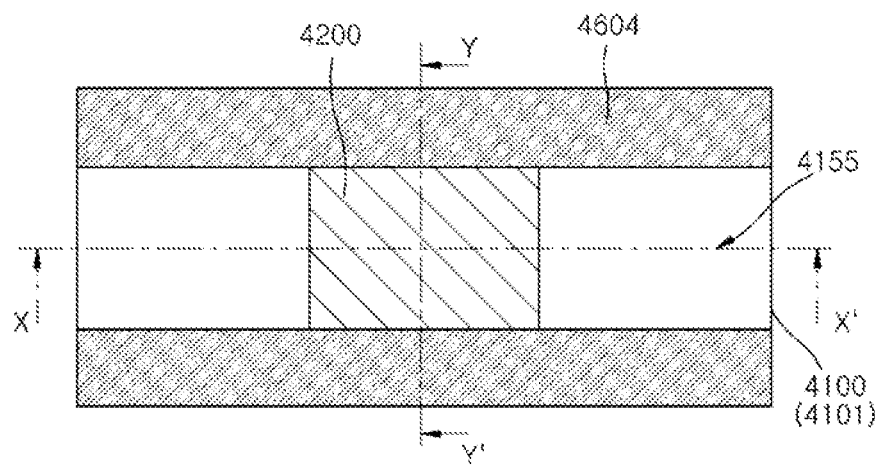
Figure 36:
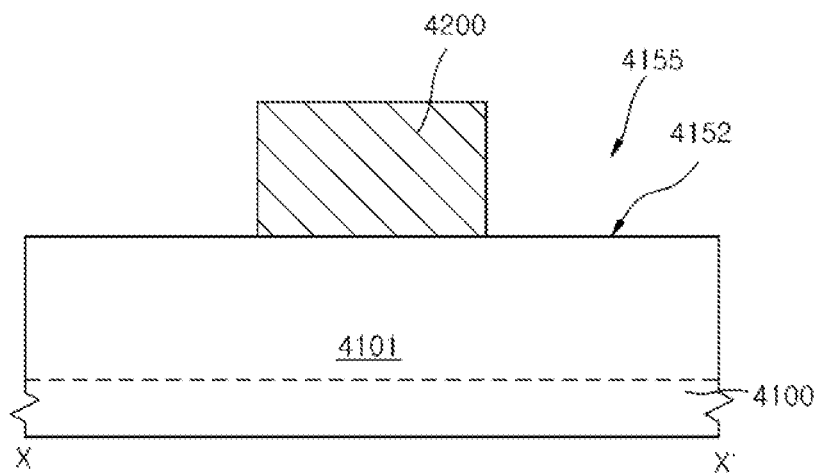

FIG. 35 is a plan view illustrating a drain mesa 4200, and FIG. 36 is a cross-sectional view taken along a line X-X' of FIG. 35. Referring to FIGS. 35 and 36, the substrate 4100 (i.e., the well region 4101) between the isolation layers 4604 may be selectively recessed to relatively protrude the first impurity region 4209 serving as the drain mesa 4200. Specifically, a mask (not shown) may be formed on the first impurity region 4209, and the substrate 4100 (i.e., the well region 4101) may be selectively etched using the mask and the isolation layers 4604 as etch masks, thereby exposing both side all surfaces of the drain mesa 4200. That is, the substrate 4100 may be recessed to protrude the drain mesa 4200 from a surface of the substrate 4100 and to form recessed portions 4155 at both sides of the drain mesa 4200. The recessed portions 4155 may be formed to have a depth which is shallower than the trenches (4153 of FIG. 32). Channel regions and sources may be formed in the well region 4101 under bottom surfaces 4152 of the recessed portions 4155 in a subsequent process. As a result, the first impurity region 4209 may relatively protrude by forming the trenches 4153 and the recessed portions 4155 and may serve as the drain mesa 4200.

Figure 37:
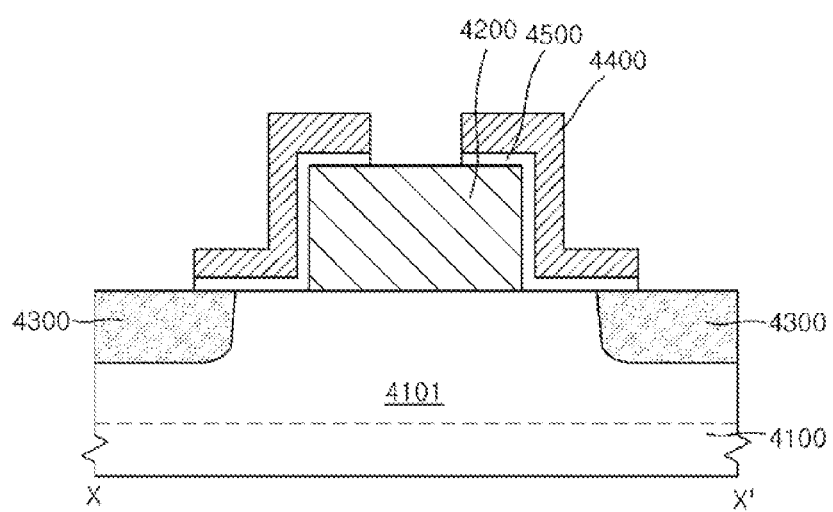

FIG. 37 is cross-sectional view illustrating floating gates 4400. Referring to FIG. 37, a gate dielectric layer 4500 may be formed on a top surface and sidewall surfaces of the drain mesa 4200 and on the bottom surfaces 4152 of the recessed portions 4155. A floating gate layer may then be formed on the gate dielectric layer 4500. The floating gate layer may be patterned to form a pair of separate floating gates 4400 that overlap with both sidewall surfaces of the drain mesa 4200 and extend onto the well region 4101. Impurity ions may be implanted into the drain mesa 4200 and the well region 4101 using the floating gates 4400 as implantation masks, thereby forming a pair of sources 4300 in the well region 4101 and a drain in the drain mesa 4200.

Figure 38:
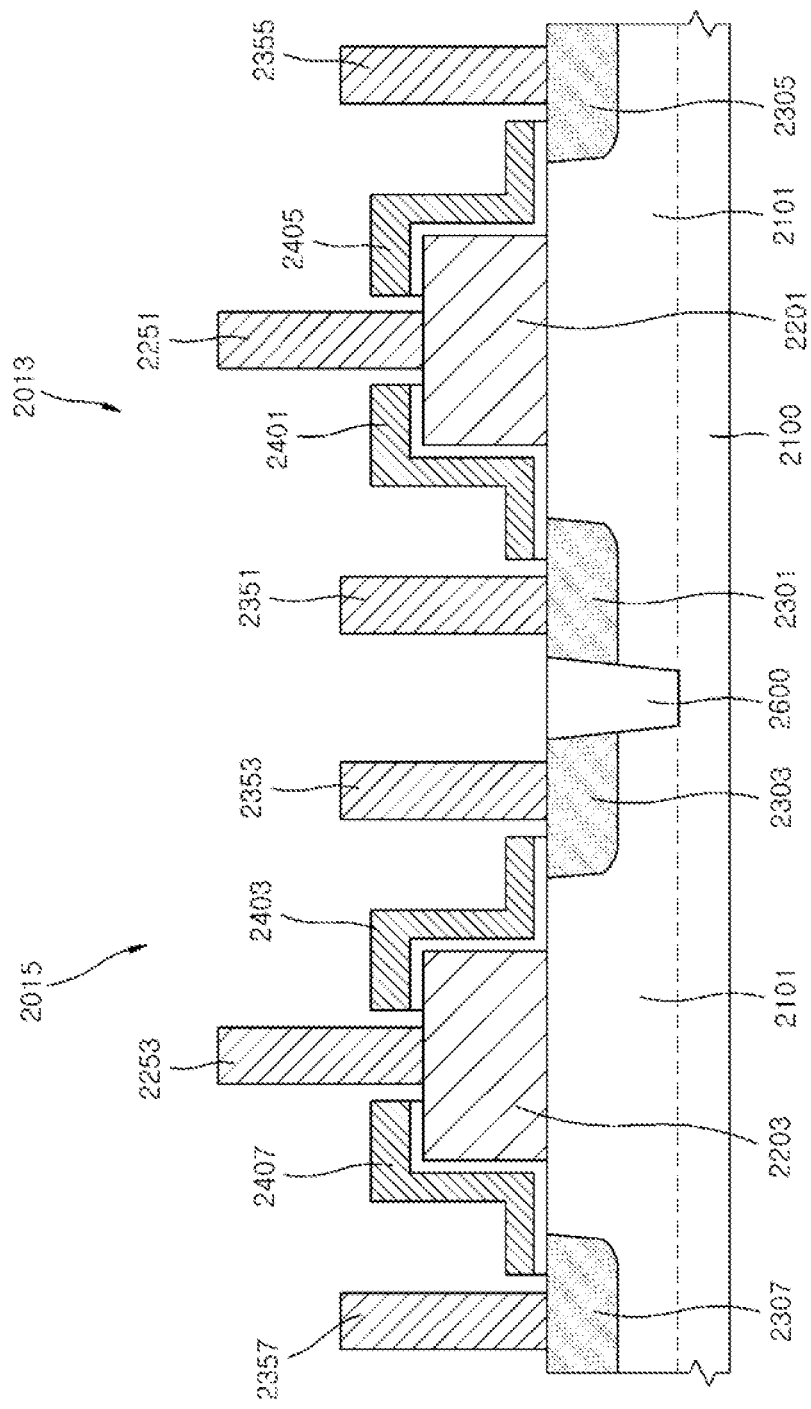
FIG. 38 illustrates a nonvolatile memory device according to an embodiment.

FIG. 38 is a cross-sectional view illustrating a portion of a cell array of a nonvolatile memory device according to an embodiment. Referring to FIG. 38, the cell array of the nonvolatile memory device according to an embodiment may include a first twin cell 2013 and a second twin cell 2015 arrayed in a row and an isolation layer 2600 disposed between the first and second twin cells 2013 and 2015. The first twin cell 2013 may include a first drain mesa 2201 protruding from a top surface of a semiconductor substrate 2100, a first source 2301 disposed in the semiconductor substrate 2100 and spaced apart from the first drain mesa 2201, a second source 2305 disposed in the semiconductor substrate 2100 opposite to the first source 2301 and spaced apart from the first drain mesa 2201, a first floating gate 2401 overlapping with a left top surface and a left sidewall surface of the first drain mesa 2201 and extending onto the first source 2301, a second floating gate 2405 overlapping with a right top surface and a right sidewall surface of the first drain mesa 2201 and extending onto the second source 2305. The first twin cell 2013 may further include a first drain electrode 2251 connected to the first drain mesa 2201, a first source electrode 2351 connected to the first source 2301, and a second source electrode 2355 connected to the second source 2305.

The second twin cell 2015 may include a second drain mesa 2203 protruding from a top surface of the semiconductor substrate 2100, a third source 2303 disposed in the semiconductor substrate 2100 and spaced apart from the second drain mesa 2203, a fourth source 2307 disposed in the semiconductor substrate 2100 opposite to the third source 2303 and spaced apart from the second drain mesa 2203, a third floating gate 2403 overlapping with a right top surface and a right sidewall surface of the second drain mesa 2203 and extending onto the third source 2303, a fourth floating gate 2407 overlapping with a left top surface and a left sidewall surface of the second drain mesa 2203 and extending onto the fourth source 2307. The second twin cell 2015 may further include a second drain electrode 2253 connected to the second drain mesa 2203, a third source electrode 2353 connected to the third source 2303, and a fourth source electrode 2357 connected to the fourth source 2307.

The isolation layer 2600 may be disposed to separate the first and second twin cells 2013 and 2015 from each other. More specifically, the isolation layer 2600 may be disposed between the first source 2301 of the first twin cell 2013 and the third source 2303 of the second twin cell 2015. In such a case, the isolation layer 2600 may vertically penetrate a well region 2101 on which the first and second twin cells 2013 and 2015 are disposed. That is, the isolation layer 2600 may divide the well region 2101 into two separate well regions. The first source 2301 and the third source 2303 separated by the isolation layer 2600 may be independently biased. Because the first source 2301 and the third source 2303 can be independently biased, a unit cell including the first floating gate 2401 and a unit cell including the third floating gate 2403 may independently execute a program operation, an erasure operation and a read operation even though the first and second drain electrodes 2251 and 2253 are electrically connected to have the same voltage level. That is even though the first and second drain electrodes 2251 and 2253 of the adjacent first and second twin cells 2013 and 2015 are electrically connected to the same bit line, the unit cell including the first floating gate 2401 and the unit cell including the third floating gate 2403 may independently execute a program operation, an erasure operation and a read operation.

According to the aforementioned embodiments, drain mesas including drain junction be disposed to protrude from a surface of a substrate, and floating gates may be disposed to overlap with at least sidewall surfaces of the drain mesas. Each of the floating gates may be formed of a single-layered conductive material or a multiple-layered conductive material. No control gate is necessarily required to constitute a single poly silicon EEPROM cell structure. Thus, if a height of the drain mesas increases, a cell coupling ratio may also be increased to improve program efficiency and erasure operation efficiency of unit cells. In addition, two adjacent unit cells nay constitute a twin cell sharing a single drain mesa. Thus, the twin cell may store two bit data therein, increasing the bit density. Moreover, a plurality of twin cells may be arrayed to share a single well region. Thus, erasure operation may be executed in units of bytes. Furthermore, because the twin cells may not require a control gate a nonvolatile memory device including the twin cells may be fabricated using a general CMOS fabrication process. Thus, the nonvolatile memory device according to the above embodiments may be readily embedded in system integrated circuit devices. Moreover, since the twin cells can be erased using a F-N tunneling mechanism, the erasure operation may be executed in units of bytes or in units of chips. In addition, if the height of the drain mesas increase, the cell coup ing ratio may be increased, improving the program efficiency and the erasure efficiency of unit cells. Thus, the planar area of the unit cell may be reduced without degradation of a cell performance if the height of the drain mesas increase.

What is claimed is:

1. A nonvolatile memory device comprising:
a plurality of twin cells arrayed over a substrate, each of the twin cells including:
a first source and a second source disposed in the substrate,
a drain mesa protruding from a surface of the substrate between the first and second sources,
a first floating gate overlapping with a first sidewall surface of the drain mesa and extending to the first source, and
a second floating gate overlapping with a second sidewall surface of the drain mesa and extending to the second source, wherein the first and the second floating gates are arranged opposite to each other with respect to the drain mesa; and
an isolation layer disposed in the substrate and separating the first source of a first twin cell among the plurality of twin cells from the second source of a second twin cell among the plurality of twin cells,
wherein the first and second floating gates extend over portions of a top surface of the drain mesa.

2. The nonvolatile memory device of claim 1, further comprising a well region disposed in the substrate,
wherein the isolation layer extends down into the substrate to divide the well region into a first well region on which the first twin cell is formed and a second well region on which the second twin cell is formed.

3. The nonvolatile memory device of claim 1, further comprising:
a common drain electrode coupled to the top surface of the drain mesa between the first and second floating gates; and
a first source electrode and a second source electrode coupled to the first and second sources, respectively.

4. The nonvolatile memory device of claim 1,
wherein the first and second floating gates are symmetrically configured with respect to the drain mesa.

5. The nonvolatile memory device of claim 1,
wherein the first and second sources are symmetrically located with respect to the drain mesa.

6. The nonvolatile memory device of claim 1,
wherein two adjacent twin cells arranged in a given row with sharing the isolation layer.

7. The nonvolatile memory device of claim 1,
wherein the drain mesa includes an first impurity region disposed along a top surface and sidewall surfaces of the drain mesa; and
wherein each of the first and second sources includes a second impurity region disposed in a top surface of the substrate.

8. A nonvolatile memory device comprising:
a drain mesa protruding from a surface of a substrate;
a first source and a second source respectively disposed in the substrate and respectively spaced apart from the drain mesa;
a first floating gate overlapping with a first sidewall surface of the drain mesa and extending to the first source;
a second floating gate overlapping with a second sidewall surface of the drain mesa and extending to the second source;
a drain electrode configured to apply a drain voltage to the drain mesa; and
a first source electrode and a second source electrode coupled to the first and second sources, respectively,
wherein a unit cell of the device includes a first memory including the first floating gate and a second memory including the second floating gate,
wherein the first and the second memories of the unit cell are separately programmed, erased or read out,
wherein the first and second floating gates extend over portions of a top surface of the drain mesa.

9. The nonvolatile memory device of claim 8,
Wherein, the common drain electrode is coupled to a top surface of the drain mesa between the first and second floating gates.

10. The nonvolatile memory device of claim 8,
wherein the first and second floating gates are symmetrically configured with respect to the drain mesa.

11. The nonvolatile memory device of claim 8,
wherein the first and second sources are symmetrically located with respect to the drain mesa.

12. The nonvolatile memory device of claim 8,
wherein the drain mesa includes an first impurity region disposed along a top surface and sidewall surfaces of the drain mesa; and
wherein each of the first and second sources includes a second impurity region disposed in a top surface of the substrate.

\* \* \* \* \*